US007834543B2

(12) United States Patent
Takata

(10) Patent No.: US 7,834,543 B2
(45) Date of Patent: Nov. 16, 2010

(54) ORGANIC EL DISPLAY APPARATUS AND METHOD OF MANUFACTURING THE SAME

(75) Inventor: Kenji Takata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 12/144,398

(22) Filed: Jun. 23, 2008

(65) Prior Publication Data
US 2009/0009069 A1 Jan. 8, 2009

(30) Foreign Application Priority Data
Jul. 3, 2007 (JP) ............................. 2007-175304
May 29, 2008 (JP) ............................. 2008-140297

(51) Int. Cl.
*H01J 1/54* (2006.01)
*H01J 1/62* (2006.01)
(52) U.S. Cl. ....................... 313/504; 313/498; 313/505; 445/23; 445/24
(58) Field of Classification Search ......... 313/498–512; 445/23, 24
See application file for complete search history.

(56) References Cited
U.S. PATENT DOCUMENTS
6,538,374 B2    3/2003    Hosokawa .................. 313/504

2002/0145382 A1*  10/2002  Lu ............................. 313/504
2004/0160176 A1*   8/2004  Kim ........................... 313/506
2008/0074041 A1*   3/2008  Nakayama .................. 313/504

FOREIGN PATENT DOCUMENTS
JP          2001-230086          8/2001

* cited by examiner

Primary Examiner—Bumsuk Won
Assistant Examiner—Nathaniel J Lee
(74) Attorney, Agent, or Firm—Fitzpatrick, Cella, Harper & Scinto

(57) ABSTRACT

Provided is an organic EL display apparatus including: a substrate; plural organic EL devices formed over the substrate, each of the organic EL devices including a first electrode, an organic layer, and a second electrode which are provided in order from a side of the substrate, the organic layer including at least a light emitting layer; plural pixel isolation films, each of which is an insulating film and formed between the first electrodes located adjacent to each other; plural auxiliary wirings which are formed on the plural pixel isolation films and include a conductive material; and plural partition walls which are formed on the auxiliary wirings and include one of an insulator and a conductor which is reverse-tapered to have reverse-tapered portions, in which the plural auxiliary wirings and the second electrodes are electrically connected with each other in positions directly under the reverse-tapered portions of the plural partition walls.

9 Claims, 7 Drawing Sheets

ORGANIC EL DISPLAY APPARATUS AND METHOD OF MANUFACTURING THE SAME

BACKGROUND OF THE INVENTION

1. Field of the Invention

The present invention relates to an organic electroluminescence (EL) display apparatus and a method of manufacturing the organic EL display apparatus.

2. Description of the Related Art

In recent years, organic EL display apparatuses using organic EL devices made of light emitting materials are actively developed and studied as display devices having advantages such as a high-speed response and a wide viewing angle.

When an organic EL display apparatus including a large number of organic EL devices is to be driven by an active matrix circuit, it is necessary to connect each of the organic EL devices (pixels) with a set of thin film transistors (TFTs) for controlling a current flowing into each of the pixels.

In the active matrix organic EL display apparatus, minute transistors and capacitors are arranged above a substrate. Therefore, in order to improve an aperture ratio, it is desirable to employ a so-called top emission type in which light emitted from each of the pixels is extracted from the opposite side to the substrate as illustrated in FIG. 3.

A conventional active matrix top emission organic EL display apparatus will be described with reference to FIGS. 3 and 4.

Each pixel includes TFTs and an organic EL device which are stacked above a glass substrate 500.

A TFT portion 501 for driving the organic EL device is formed on the glass substrate 500. FIG. 3 illustrates a source region 510, a poly-Si layer 511, a drain region 512, a gate insulating film 513, a gate electrode 514, and an interlayer insulating film 515.

The TFT portion 501 is covered with an inorganic insulating film 517 and further covered with a planarization film 518 to planarize a surface of the glass substrate 500. A reflecting electrode (first electrode) 520 is formed on the planarization film 518.

The reflecting electrode 520 is formed for each pixel by patterning. The reflecting electrode 520 is electrically connected with a drain electrode 516 of one of TFTs included in the TFT portion 501 through a contact hole formed in the inorganic insulating film 517 and the planarization film 518.

A pixel isolation film 530 is an insulating film provided between adjacent pixels and arranged to cover a circumference portion of the reflecting electrode 520.

An organic layer 525 is formed on the reflecting electrode (first electrode) 520 serving as an anode. The organic layer 525 includes a hole transporting layer 523, a light emitting layer 522, and an electron transporting layer 524. A transparent electrode (second electrode) 521 serving as a cathode (common electrode) is formed on the organic layer 525.

In order to protect the organic EL device from moisture, a sealing glass material 540 is bonded to the resultant glass substrate 500 by a UV curable epoxy resin. A gap portion between the resultant glass substrate 500 and the sealing glass material 540 is filled with an inert gas 541.

As described above, in the case of the top emission type in which light is extracted from the opposite side to the substrate, a thin film made of a transparent conductive material such as indium tin oxide (ITO) or indium zinc oxide (IZO) is used for the second electrode. However, the transparent conductive material has a higher resistance than a resistance of a metal material.

Therefore, voltage drop is more likely to occur in the second electrode to apply different voltages to respective organic EL devices provided on a display surface. Thus, there is a problem that reduction in display performance due to a voltage gradient, such as reduction in light emission intensity at the central region of the display surface occurs.

In order to suppress the voltage gradient, it is desirable to form a low-resistance auxiliary wiring. In order to ensure an aperture of each of pixels, it is necessary to form the auxiliary wiring on a non-display region such as a region between pixels.

When the low-resistance auxiliary wiring is to be formed after the formation of the organic layer, an organic material of the organic layer deteriorates with water, an organic solvent, or ultraviolet rays. Therefore, it is difficult to pattern the formed auxiliary wiring by photolithography, so it is necessary to pattern the auxiliary wiring using a metal mask during the formation thereof.

When a film is to be patterned using a metal mask during the formation thereof by a vacuum vapor deposition method with a low-resistance material such as a metal material, it is difficult to maintain a constant distance between a substrate and the metal mask and to maintain high patterning precision because the metal material has a high evaporation temperature and the metal mask expands by radiation heat. In particular, in the case of a high-definition display panel, it is further difficult to perform patterning because a pixel interval is small.

Therefore, measures of providing the auxiliary wiring (electrically connected with the second electrode) between pixels before the formation of the organic layer have been proposed (Japanese Patent Application Laid-Open Nos. 2001-195008, 2002-318553, and 2001-230086).

Japanese Patent Application Laid-Open No. 2001-230086 discloses that an auxiliary electrode which includes an upper auxiliary electrode and a lower auxiliary electrode and has an overhanging cross-sectional shape is formed before the formation of the organic layer (see FIGS. 13 to 16) in Japanese Patent Application Laid-Open No. 2001-230086. The auxiliary electrode can be reliably electrically connected with an upper electrode (corresponding to the second electrode) through a portion located under an overhung upper portion of the auxiliary electrode.

The organic layer is made of an organic semiconductor material whose mobility is approximately $10^{-3}$ cm$^2$/V·s to $10^{-6}$ cm$^2$/V·s and thus whose resistance is extremely high. When the organic layer is located between the second electrode and the auxiliary wiring provided between pixels, it is difficult to electrically connect the auxiliary wiring with the second electrode. Therefore, in the case of the structure disclosed in Japanese Patent Application Laid-Open No. 2001-195008 or 2002-318553, as illustrated in FIG. 2, it is necessary to pattern the entire organic layer for the organic EL device so as to form a region in which no organic layer is provided on the auxiliary wiring.

In order to pattern the entire organic layer for organic EL devices so as to form a region in which no organic layer is provided on the auxiliary wiring, the required number of steps including alignment is equal to the number of organic layers. An apparatus cost required in the case where the entire organic layer is to be patterned is higher than an apparatus cost required in the case where only a part of the organic layer is to be patterned, such as the case where only the light emitting layer is to be patterned for each pixel. In addition, there are problems such as reduction in use efficiency of an expensive organic material used for the organic EL device, which is caused by lengthening a tact time required for film formation, and reduction in yield due to patterning deviation in a patterning step.

In the structure disclosed in Japanese Patent Application Laid-Open No. 2001-230086, even when the organic layer is not patterned for each pixel, a region in which the auxiliary electrode is exposed can be obtained without being covered with the organic layer. The region in which the auxiliary electrode is exposed corresponds to a rear surface of the upper auxiliary electrode and a side surface of the lower auxiliary electrode. Therefore, in order to bring the second electrode (upper electrode) to contact with the region, it is necessary to form the second electrode at a thickness equal to or larger than a required thickness. However, in the case of the organic EL display apparatus using the organic EL device of the top emission type in which light is extracted from the opposite side to the substrate, it is difficult to obtain high light extraction efficiency due to reduction in light transmittance.

SUMMARY OF THE INVENTION

An object of the present invention is to provide an organic EL display apparatus in which an auxiliary wiring and a second electrode serving as a cathode can be connected with each other without patterning an organic layer for each pixel or without forming the second electrode at a thickness equal to or larger than a required thickness.

In order to achieve the above-mentioned objects, an organic EL display apparatus of the present invention includes: a substrate; plural organic EL devices formed on the substrate, each of the organic EL devices including a first electrode, an organic layer, and a second electrode which are provided in order from a side of the substrate, the organic layer including at least a light emitting layer; plural pixel isolation films, each of which is an insulating film and formed between the first electrodes located adjacent to each other; plural auxiliary wirings which are formed on the plural pixel isolation films and include a conductive material; and plural partition walls which are formed on the auxiliary wirings and include one of an insulator and a conductor which is reverse-tapered to have reverse-tapered portions, in which the plural auxiliary wirings and the second electrodes are electrically connected with each other in positions directly under the reverse-tapered portions of the plural partition walls.

According to the present invention, the auxiliary wiring and the second electrode can be connected with each other without patterning the organic layer for each pixel or without forming the second electrode at the thickness equal to or larger than the required thickness. Further, it is possible to provide an organic EL display apparatus which is produced by a manufacturing process in which the number of patterning steps is small and which has higher light extraction efficiency.

Further features of the present invention will become apparent from the following description of exemplary embodiment with reference to the attached drawings.

BRIEF DESCRIPTION OF THE DRAWINGS

FIGS. 9A, 9B, 9C, 9D, 9E, 9F, 9G, 9H, 9I, 9J, 9K, 9L, 9M and 9N are schematic cross-sectional views illustrating examples of a part of the organic EL display apparatus according to the present invention.

DESCRIPTION OF THE EMBODIMENT

Hereinafter, an exemplary embodiment for carrying out the present invention is described with reference to the attached drawings. However, the present invention is not limited to this embodiment.

Figure 1:
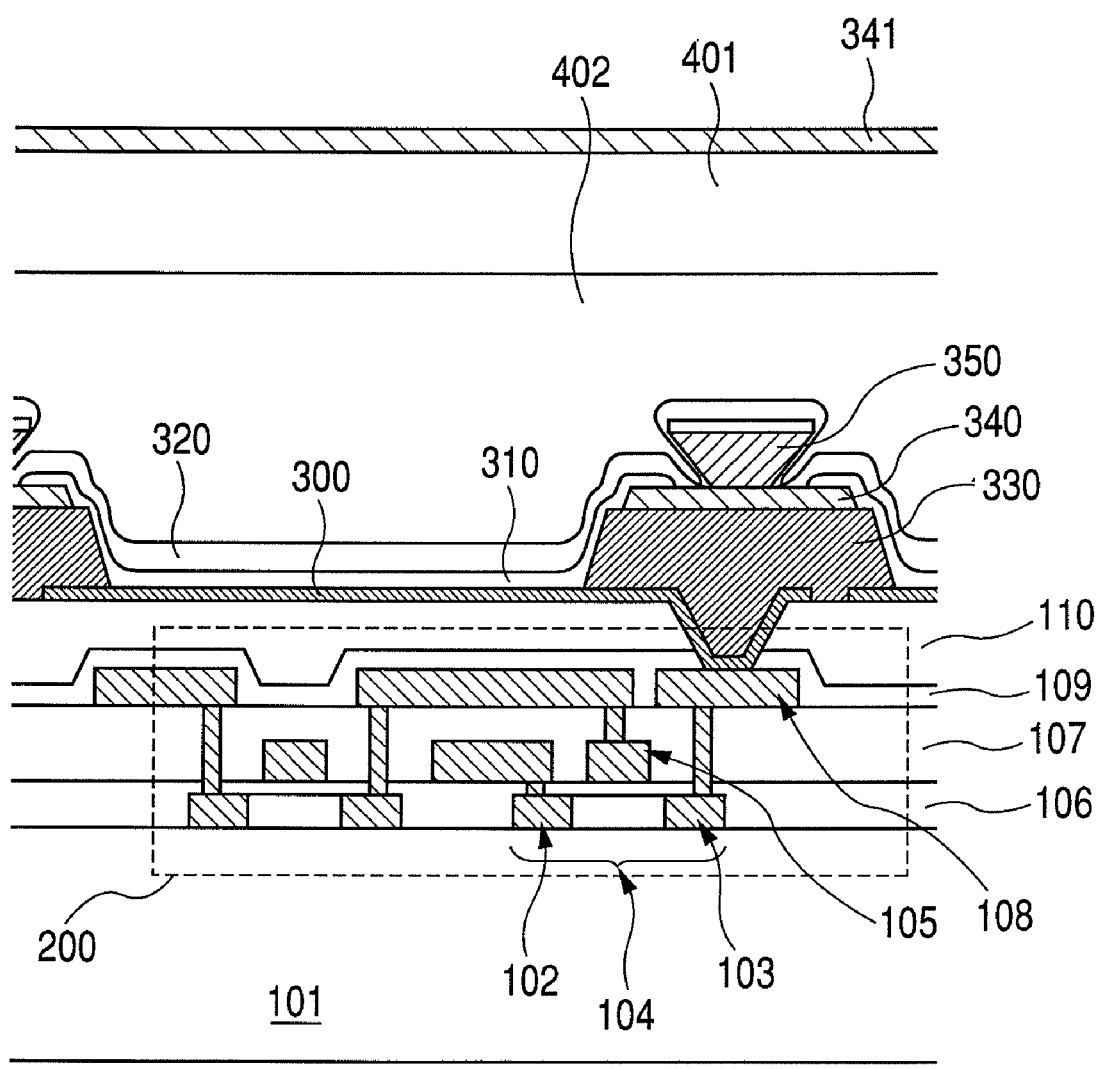
FIG. 1 is a schematic cross-sectional view illustrating an organic EL display apparatus according to the present invention.
Figure 2:
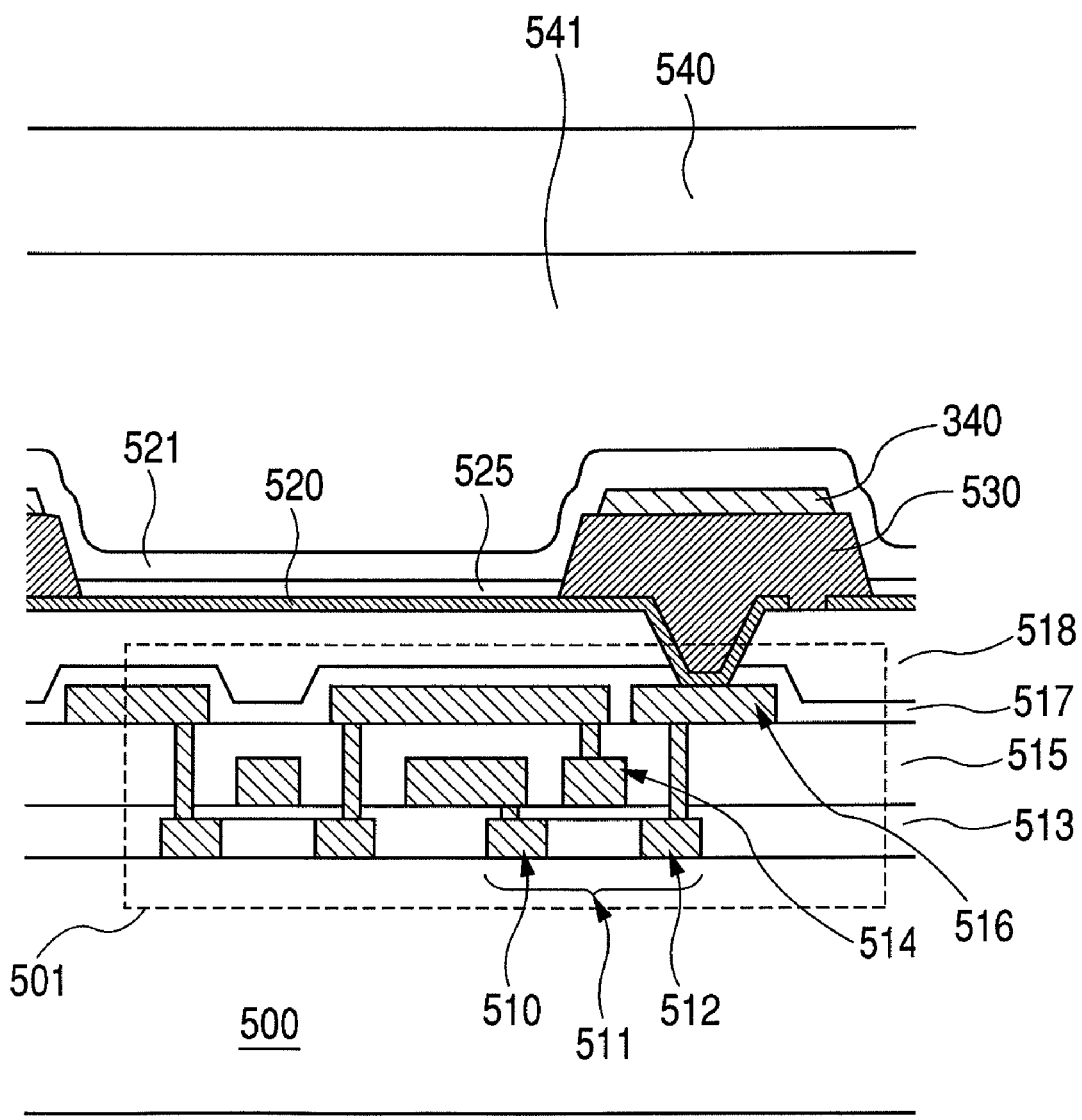
FIG. 2 is a schematic cross-sectional view illustrating a conventional active matrix organic EL display apparatus.
Figure 3:
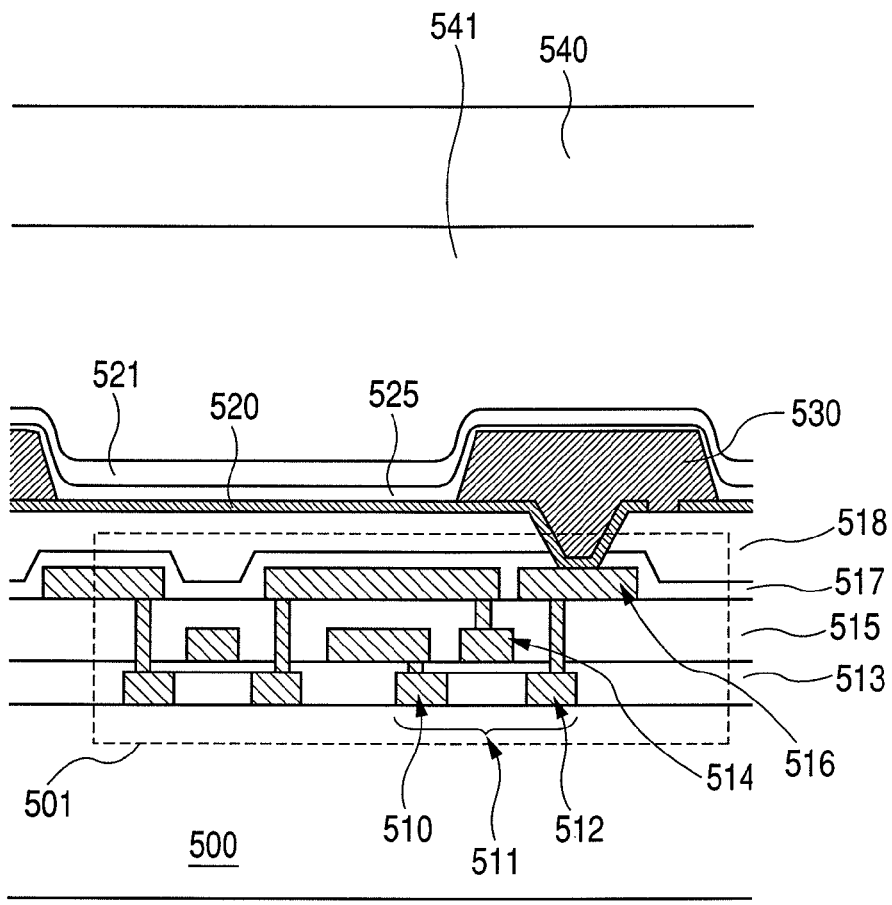
FIG. 3 is a schematic cross-sectional view illustrating a conventional active matrix organic EL display apparatus.
Figure 4:
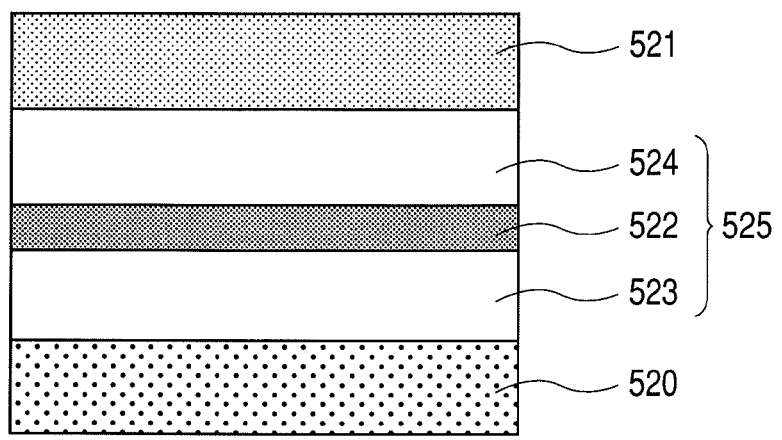
FIG. 4 is a schematic cross-sectional view illustrating an organic layer.
Figure 5:
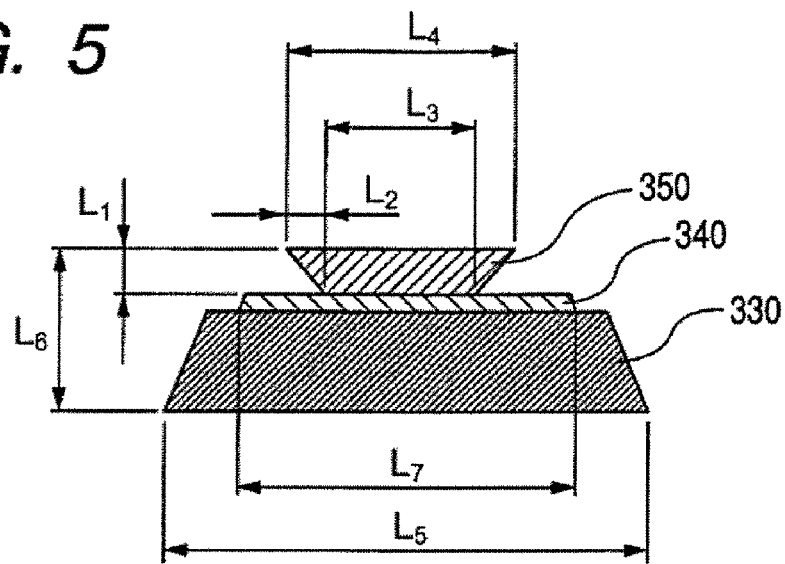
FIG. 5 is a schematic cross-sectional view illustrating a part of the organic EL display apparatus according to the present invention.
Figure 6A:
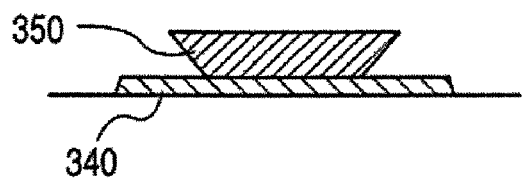
FIGS. 6A, 6B, and 6C are schematic views illustrating a manufacturing process of the organic EL display apparatus according to the present invention.
Figure 6B:
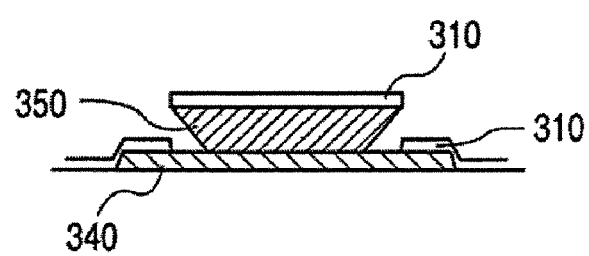
Figure 6C:
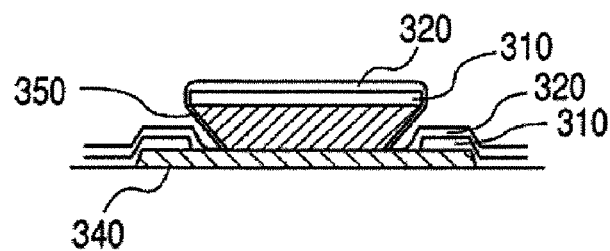
Figure 7:
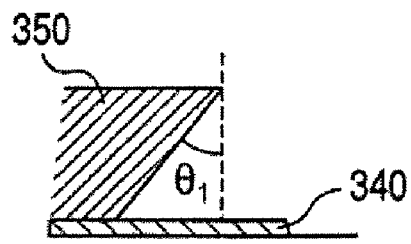
FIG. 7 is a schematic cross-sectional view illustrating a part of the organic EL display apparatus according to the present invention.
Figure 8:
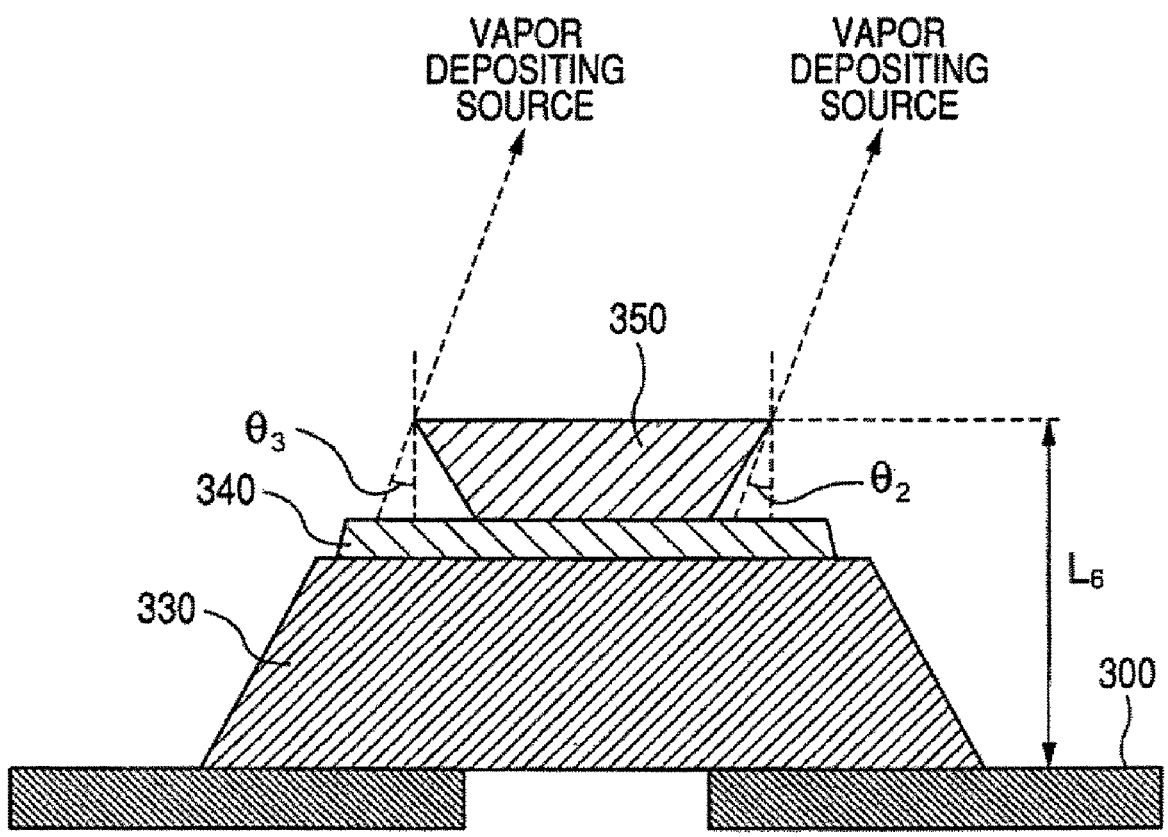
FIG. 8 is a schematic cross-sectional view illustrating a part of the organic EL display apparatus according to the present invention.

FIG. 1 is a schematic view illustrating an organic EL display apparatus according to this embodiment. The organic EL display apparatus includes plural organic EL devices each having a first electrode 300, an organic layer 310, and a second electrode 320 which are provided on a substrate 101. The organic layer 310 includes at least a light emitting layer. Organic EL light emitted from the light emitting layer is extracted through the second electrode 320. The organic EL display apparatus further includes: insulating pixel isolation films 330 each of which is provided between the first electrodes located adjacent to each other; and auxiliary wirings 340 which are provided on the pixel isolation films 330 and made of a conductive material.

The organic EL display apparatus according to this embodiment further includes partition walls 350 which are formed on the auxiliary wirings 340 and made of a reverse-tapered insulator or conductor. The auxiliary wiring 340 and the second electrode 320 are electrically connected with each other in a position directly under a reverse-tapered portion of the partition wall 350.

Hereinafter, a structure of the organic EL display apparatus according to this embodiment will be specifically described along with a manufacturing method thereof.

A TFT portion 200 for driving one of the organic EL devices is formed on the substrate 101 made of glass. The substrate 101 may be transparent or non-transparent. The substrate 101 may be an insulating substrate made of a synthetic resin or the like, a conductive substrate, or a semiconductor substrate. Note that an insulating film such as a silicon oxide film or a silicon nitride film is formed on the surface of each of the conductive substrate and the semiconductor substrate. An active layer of each of TFTs included in the TFT portion 200 is made of poly-Si 104. However, the material of the active layer is not limited to poly-silicon. For example, amorphous silicon or microcrystalline silicon may be used. FIG. 1 illustrates a source region 102, a drain region 103, a gate electrode 105, a gate insulating film 106, and an interlayer insulating film 107.

The TFT portion 200 is covered with an inorganic insulating film 109 made of silicon nitride and further covered with a planarization film 110 made of an acrylic resin to planarize an uneven part of the TFT portion 200. The inorganic insulating film 109 may be an inorganic insulating film such as a silicon oxynitride film or a silicon oxide film. The planarization film 110 may be made of a polyimide resin, a norbornene resin, a fluoride resin, or the like.

The first electrode (reflecting electrode in this embodiment) 300 is formed by patterning in a position corresponding to each pixel. The first electrode 300 is electrically connected with a drain electrode 108 of one of the TFTs included in the TFT portion 200 through a contact hole formed in the inorganic insulating film 109 and the planarization film 110. The first electrode 300 and the drain electrode 108 may be directly connected with each other or connected with each other through a metal film such as an aluminum film or a conductive oxide film such as an indium tin oxide (ITO) film.

A chromium film is used as the first electrode 300. A silver film, a silver film with additives, an aluminum film, an aluminum film with additives, or an aluminum alloy film may be used. Also, a transparent conductive oxide film such as an ITO film or an indium zinc oxide (IZO) film may be used.

In order to improve carrier injection to the organic layer, an electrode having a high work function, for example, a transparent conductive oxide film such as an ITO film or an IZO film may be further formed on the first electrode 300.

The pixel isolation films 330 are formed to cover circumference portions of the first electrodes 300 so as to section the respective first electrodes 300. Each of the pixel isolation films 330 may be an inorganic film such as a silicon oxynitride film or a silicon oxide film. Also, an acrylic resin, a polyimide resin, or a novolac resin may be used.

The auxiliary wiring 340 is formed on the pixel isolation film 330 so as to contact therewith. An aluminum film is used as the auxiliary wiring 340. Another metal film, an aluminum film with additives, or another metal film with additives may be used. The auxiliary wiring 340 desirably has a surface parallel to the surface of the substrate in order to more reliably deposit a material of the second electrode to be formed later. A film for the auxiliary wiring 340 is formed by a sputtering method and patterned by, for example, photolithography to be formed on the pixel isolation film 330 provided between pixels. The film for the auxiliary wiring 340 may be formed by a vapor deposition method or a CVD method.

The partition wall 350 made of a reverse-tapered insulator or conductor is formed on the auxiliary wiring 340. The partition wall 350 is obtained as follows. A negative photosensitive material mixed with a UV absorbent is applied by a spin coating method and prebaked. After that, UV exposure using a photomask having a predetermined pattern and development are performed. Then, the resultant material is cured by heating. When the partition wall 350 is made of an insulator, an acrylic resin, a polyimide resin, a novolac resin, or the like is desirably used as the insulator. When the partition wall 350 is made of a conductor, a molybdenum material, a tungsten material, an aluminum material, a titanium material, a chromium material, a silver material, those with additives, or an alloy thereof is desirably used as the conductor. When a metal material is used for the partition wall 350, it can be expected to reduce a wiring resistance of the auxiliary wiring 340 because the auxiliary wiring 340 and the partition wall 350 are electrically connected with each other.

The partition wall 350 may include plural layers. At least one of the plural layers may be an inorganic film such as a silicon oxide film, a silicon nitride film, or a silicon oxynitride film.

A shape of the partition wall 350 is described with reference to FIGS. 1, 5, 6, 7, 8, and 9A to 9N.

The reverse-tapered shape refers to a shape in which a top side width $L_3$ and a bottom side width $L_4$ have a relationship of $L_3<L_4$. Therefore, as illustrated in FIGS. 1, 5, 6, and 7, a shape whose oblique surfaces are formed to be flat and whose width monotonously reduces to the substrate side may be used. In addition, as illustrated in FIGS. 9A to 9N, a shape whose oblique surface is curved or a shape whose width reduces stepwise may be used. That is, the shape of the partition wall in the present invention is a shape for producing shadows (regions in which the organic layer is not formed) on the auxiliary wiring 340 at the time of formation of the organic layer.

When the organic layer 310 is formed by vacuum vapor deposition using a point vapor depositing source, the partition wall 350 is provided as follows. That is, the partition wall 350 is provided such that an angle $\theta_1$ and an angle $\theta_2$ satisfy $\theta_1 \geq \theta_2$. The angle $\theta_1$ is formed between the normal to the substrate and a straight line joining an upper end portion of the partition wall 350 with a lower end portion thereof. The angle $\theta_2$ is formed between the normal to the substrate and a straight line joining the point vapor depositing source with an upper end located on the center side of the substrate, of the partition wall 350 provided in an outermost end of the substrate. Therefore, the shadows (regions in which the organic layer 310 is not formed) can be produced on the auxiliary wiring 340.

When the region in which the organic layer 310 is not formed on the first electrode can be produced by the partition wall 350, the first electrode and the second electrode are short-circuited. In order to prevent this, a width $L_4$ of the partition wall 350 is desirably not larger than a width $L_5$ of the pixel isolation film 330. In other words, the partition wall 350 is desirably provided to satisfy $L_4 \leq L_5$.

When a width $L_7$ of the auxiliary wiring 340 is smaller than the width $L_4$ of the partition wall 350, an area in which the second electrode 320 formed on the shadows produced by the partition wall 350 is in contact with the auxiliary wiring 340 becomes smaller. Therefore, the width $L_7$ of the auxiliary wiring 340 is desirably not smaller than the width $L_4$ of the partition wall 350. In other words, the partition wall 350 is desirably provided to satisfy $L_4 \leq L_7$.

A height $L_1$ of the partition wall 350 from the auxiliary wiring 340 is a height capable of being provided using a photosensitive resin, typically, a height within a range of 0.5 μm or more to 5 μm or less. The height $L_1$ is desirably a thickness (height) which is capable of preventing the first electrode and the second electrode from being short-circuited as in the case of $L_4$ and which is capable of producing the regions in which the organic layer 310 is not formed on the auxiliary wiring 340.

Specifically, when an angle formed between the normal to the substrate and a straight line joining the point vapor depositing source with an upper end located on the end portion side of the substrate, of the partition wall 350 provided in the outermost end of the substrate is expressed by $\theta_3$, the partition wall 350, the auxiliary wiring 340, and the pixel isolation film 330 are desirably formed such that a total height $L_6$ thereof satisfies Expression 1.

$$(L_6 \times \tan\theta_3 + L_4/2) \leq L_5/2 \qquad \text{<Expression 1>}$$

Note that the partition wall 350 may be discontinuously or continuously provided between pixels. Plural partition walls or a single partition wall may be provided between pixels.

Figure 10:
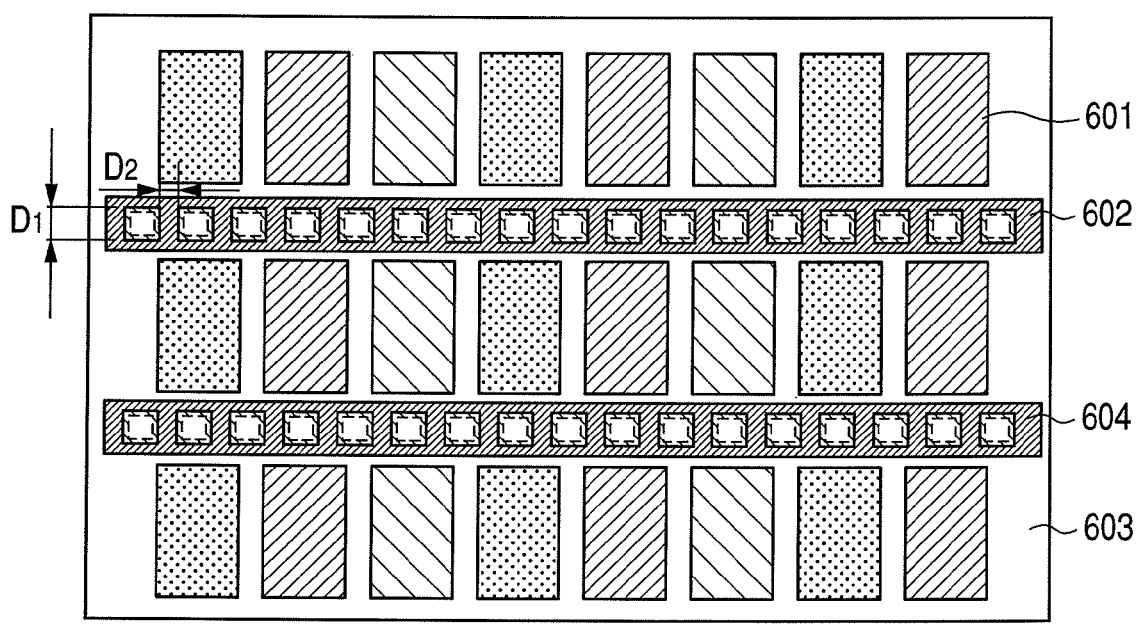
FIG. 10 is a schematic plan view illustrating a part of the organic EL display apparatus according to the present invention.

When the partition wall is discontinuously provided, that is, when the partition walls are intermittently provided as illustrated in FIG. 10, an area of a portion 604 shaded by the reverse-tapered portion of each of the partition walls increases. Therefore, an auxiliary wiring 602 and a second electrode 603 can be more reliably electrically connected with each other. In order to increase the area of the shaded portion 604, a partition wall width $D_1$ in a direction crossing the direction in which the partition walls are arranged is desirably larger than a partition wall interval $D_2$ between adjacent partition walls, that is, $D_1 > D_2$ is desirably satisfied.

When pixels are arranged in X-Y matrix, the auxiliary wiring 340 and the partition wall 350 may be provided in each region between pixels in at least one of the X-direction and the Y-direction or in only a region between arbitrary pixels. When the auxiliary wiring 340 is to be provided in one of the X-direction and the Y-direction, plural auxiliary wirings are arranged in parallel within a display region.

The organic layer 310 is formed to cover the entire display region including the first electrode 300, the pixel isolation film 330, and the partition wall 350. The organic layer 310 is desirably formed by a vacuum vapor deposition method. When the organic layer 310 is desirably formed by the vacuum vapor deposition method, material particles evaporated from the vapor depositing source are incident on an object at the same angle. Therefore, the regions in which the organic layer 310 is not formed are produced on the shadows of the auxiliary wiring 340 because the reverse-tapered portion of the partition wall 350 acts as a canopy.

A method of forming a film which is lower in coverage performance than the second electrode 320 is desirably used to form the organic layer 310. A film formation method other than the vacuum vapor deposition method may be used. The vacuum vapor deposition method may be an oblique vapor deposition method of forming a film in a direction oblique to a substrate.

The organic layer 310 includes, for example, three layers, that is, a hole transporting layer, a light emitting layer, and an electron transporting layer. The organic layer 310 may include only the light emitting layer or plural layers such as two layers or four layers. For example, electron donative FL03 is used for the hole transporting layer. Any other material may also be used.

The light emitting layer of the organic layer 310 is separately colored for each light emission color by a metal mask. For example, CBP doped with Ir(piq)$_3$ is used for a red light emitting layer. For example, Alq$_3$ doped with coumarin is used for a green light emitting layer. For example, B-Alq$_3$ doped with perylene is used for a blue light emitting layer. Any other material may also be used.

For example, bathophenanthroline having electron acceptability is used for the electron transporting layer. Any other material may also be used.

Any one of the hole transporting layer and the electron transporting layer which are included in the organic layer 310 may be separately colored for each light emission color by a metal mask.

The following formulae show molecular structures of a material for forming the organic layer 310.

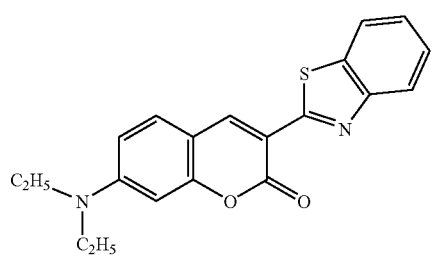

Coumarin 6

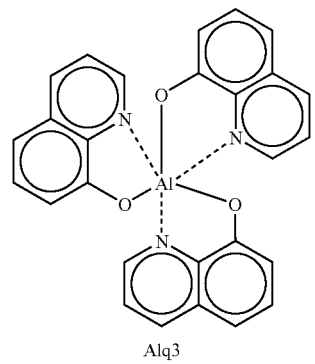

Alq3

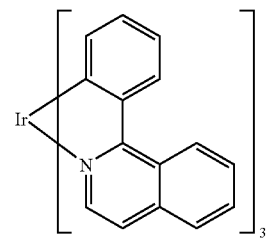

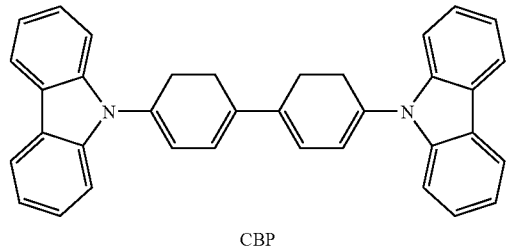

CBP

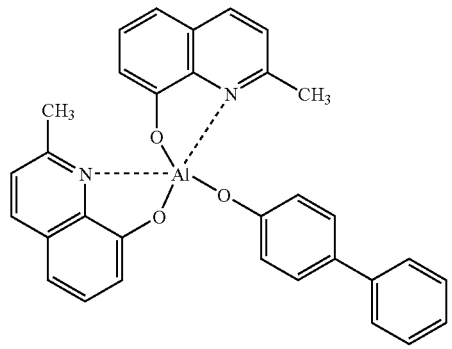

BAlq

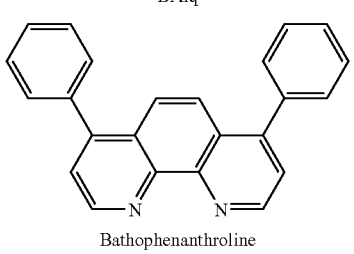

Bathophenanthroline

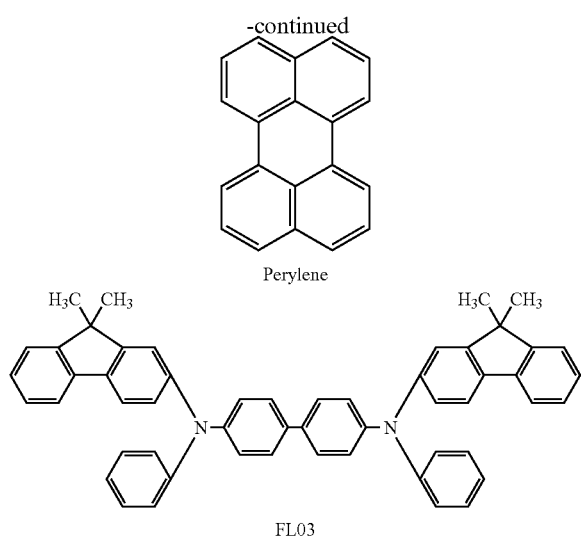

-continued

Perylene

FL03

The transparent electrode (second electrode) 320 serving as a cathode is formed on the organic layer 310. A desirable thickness of the second electrode 320 is 20 nm or more to 45 nm or less. When the thickness is larger than 45 nm, light transmittance reduces to lower light extraction efficiency of light emitted from the organic layer 310. On the other hand, when the thickness is smaller than 20 nm, a sheet resistance increases. Therefore, even when the auxiliary wiring is used, it is difficult to prevent unevenness in brightness of a display surface.

The second electrode 320 is desirably formed by a sputtering method. When the second electrode 320 is formed by a film formation method which is more excellent in coverage performance for unevenness than the vacuum vapor deposition method, the second electrode 320 is provided in the region on the auxiliary wiring 340, in which the organic layer 310 is not formed, that is, in the position directly under the reverse-tapered portion of the partition wall 350. As a result, the auxiliary wiring 340 and the second electrode 320 are electrically connected with each other in the position directly under the reverse-tapered portion of the partition wall 350. Therefore, even when the organic layer 310 is not formed for each pixel by patterning using a metal mask, the auxiliary wiring 340 and the second electrode 320 can be electrically connected with each other. Thus, it is possible to provide the organic EL display apparatus produced by the manufacturing process in which the number of patterning steps is small.

In order to form the second electrode 320, a film formation method having excellent coverage performance is desirably used. A CVD method may be also used. Any other film formation method may also be used.

An indium zinc oxide (IZO) film is used as the second electrode 320. A transparent conductive oxide film made of, for example, indium tin oxide (ITO), may also be used. A semi-transparent metal film made of, for example, silver, aluminum, or gold, may also be used.

In this embodiment, the first electrode serves as the anode and the second electrode serves as the cathode. However, a reverse structure is employed in some cases (Japanese Patent Application Laid-Open No. 2001-203080).

Even in such a structure, a transparent conductive oxide film made of, for example, an indium zinc oxide (IZO) film or indium tin oxide (ITO), or a semi-transparent metal film made of, for example, silver, aluminum, or gold can be used as the second electrode serving as the anode. In order to form the second electrode, a film formation method having excellent coverage performance, such as a sputtering method or a CVD method, is desirably used. Any other film formation method having excellent coverage performance may also be used.

In order to prevent the organic EL display apparatus from deteriorating due to moisture from the outside, a sealing glass material 401 is bonded to the resultant substrate 101 by a UV curable epoxy resin in a nitrogen atmosphere at a dew point of −60° C. or lower.

A hygroscopic film such as a strontium oxide film or a calcium oxide film is desirably provided on the organic EL device side of the sealing glass material 401. In this embodiment, a gap portion between the resultant glass substrate 101 and the sealing glass material 401 is filled with dry nitrogen 402.

The sealing glass material 401 is used for sealing. An inorganic insulating film such as a silicon nitride film, a silicon oxynitride film, or a silicon oxide film may be used for sealing.

A polarizing plate 341 including a phase difference film and a polarizing film is desirably provided on the sealing glass material 401. However, the polarizing plate 341 is not necessarily provided. The phase difference film and the polarizing film may be bonded to each other by a bonding material.

The organic EL display apparatus and the manufacturing method thereof according to the present invention can be applied to display sections of the various electrical devices. For example, the organic EL display apparatus and the manufacturing method thereof according to the present invention can be applied to an electronic finder section of a digital camera and an illumination device.

While the present invention has been described with reference to exemplary embodiment, it is to be understood that the invention is not limited to the disclosed exemplary embodiments. The scope of the following claims is to be accorded the broadest interpretation so as to encompass all such modifications and equivalent structures and functions.

PART LIST 101 glass substrate
102 source region
103 drain region
104 poly-Si layer
105 gate electrode
106 gate insulating film
107 interlayer insulating film
108 drain electrode
109 inorganic insulating film
110 planarization film
200 TFT portion
300 reflecting electrode (first electrode)
310 organic layer
320 transparent electrode (second electrode)
330 pixel isolation film
340 auxiliary wiring
341 polarizing plate
350 partition wall
401 sealing glass material
402 dry nitrogen
500 glass substrate
501 TFT portion
510 source region
511 poly-Si layer
512 drain region
513 gate insulating film 514 gate electrode
515 interlayer insulating film
516 drain electrode
517 inorganic insulating film
518 organic planarization film
520 reflecting electrode (first electrode)
521 transparent electrode
522 light emitting layer
523 hole transporting layer
524 electron transporting layer
525 organic layer
530 pixel isolation film
540 sealing glass material
541 inert gas This application claims the benefit of Japanese Patent Applications Nos. 2007-175304 filed on Jul. 3, 2007 and 2008-140297 filed on May 29, 2008, which are hereby incorporated by reference herein in their entirety.

What is claimed is:

1. An organic electroluminescence display apparatus comprising:
    a substrate;
    plural organic electroluminescence devices formed on the substrate, each of the organic electroluminescence devices including a first electrode, an organic layer, and a second electrode which are provided in order from a side of the substrate, the organic layer including at least a light emitting layer;
    plural pixel isolation films, each of which is an insulating film and formed between the first electrodes located adjacent to each other;
    plural auxiliary wirings which are formed on the plural pixel isolation films and include a conductive material; and
    plural partition walls which are formed on the auxiliary wirings and include one of an insulator and a conductor which is reverse-tapered to have reverse-tapered portions,
    wherein the plural auxiliary wirings and the second electrodes are electrically connected with each other in positions directly under the reverse-tapered portions of the plural partition walls.

2. The organic electroluminescence display apparatus according to claim 1, wherein the organic layers cover an entire display region including the first electrodes, the pixel isolation films, and the partition walls.

3. The organic electroluminescence display apparatus according to claim 1, wherein the second electrode comprises a transparent conductive material to extract organic electroluminescence light through the second electrode.

4. The organic electroluminescence display apparatus according to claim 1, wherein each of the partition walls comprises plural layers.

5. The organic electroluminescence display apparatus according to claim 1, wherein:
    the plural auxiliary wirings are arranged in a display region in parallel; and
    the partition walls are intermittently provided at intervals in a direction in which the auxiliary wirings are arranged.

6. The organic electroluminescence display apparatus according to claim 1, wherein the second electrode has a thickness of 20 nm or more to 45 nm or less.

7. A method of manufacturing an organic electroluminescence display apparatus including:
    a substrate,
    plural organic electroluminescence devices formed on the substrate, each of the organic electroluminescence devices including a first electrode, an organic layer, and a second electrode, the organic layer including at least a light emitting layer,
    plural pixel isolation films, each of which is an insulating film and formed between the first electrodes located adjacent to each other,
    plural auxiliary wirings which are formed on the plural pixel isolation films and include a conductive material, and
    plural partition walls, the method comprising:
    forming the first electrodes on the substrate;
    forming the pixel isolation films to cover circumference portions of the first electrodes so as to section the respective first electrodes;
    forming the auxiliary wirings on the pixel isolation films;
    forming, on the auxiliary wirings, plural partition walls including one of an insulator and a conductor which is reverse-tapered to have reverse-tapered portions;
    forming the organic layers to cover an entire display region including the first electrodes, the pixel isolation films, and the partition walls; and
    forming the second electrodes on the organic layers to electrically connect the auxiliary wirings with the second electrodes in positions just under the reverse-tapered portions of the partition walls.

8. The method of manufacturing an organic electroluminescence display apparatus according to claim 7, wherein the forming the organic layer comprises a vacuum vapor deposition method.

9. The method of manufacturing an organic electroluminescence display apparatus according to claim 7, wherein the forming the second electrodes comprises a sputtering method.

* * * * *